US010673223B2

(12) United States Patent
Macerini et al.

(10) Patent No.: US 10,673,223 B2
(45) Date of Patent: Jun. 2, 2020

(54) ARC FAULT DETECTION ARRANGEMENT FOR A DC ELECTRIC BUS

(71) Applicant: ABB Schweiz AG, Baden (CH)

(72) Inventors: Sauro Macerini, Bucine (IT); Mirco Mirra, Terranuova Bracciolini (IT)

(73) Assignee: ABB Schweiz AG, Baden (CH)

( * ) Notice: Subject to any disclaimer, the term of this patent is extended or adjusted under 35 U.S.C. 154(b) by 306 days.

(21) Appl. No.: 15/675,098

(22) Filed: Aug. 11, 2017

(65) Prior Publication Data

US 2018/0048137 A1 Feb. 15, 2018

(30) Foreign Application Priority Data

Aug. 11, 2016 (EP) ..................................... 16183705

(51) Int. Cl.
*H02H 1/00* (2006.01)
*H02H 7/20* (2006.01)
(Continued)

(52) U.S. Cl.
CPC ........... *H02H 1/0015* (2013.01); *G01R 31/12* (2013.01); *G01R 31/50* (2020.01); *H01H 9/50* (2013.01);
(Continued)

(58) Field of Classification Search
CPC ........ H02H 1/0015; H02H 3/044; H02H 3/33; H02H 7/20; G01R 31/024; G01R 31/12;
(Continued)

(56) References Cited

U.S. PATENT DOCUMENTS 8,599,523 B1 12/2013 Ostrovsky et al.
2013/0038971 A1 2/2013 Ward et al.
(Continued)

FOREIGN PATENT DOCUMENTS

DE 2425080 A1 12/1975
EP 2393178 A2 12/2011
(Continued)

OTHER PUBLICATIONS

European Search Report, EP16183705, ABB Schweiz AG, Mar. 20, 2017, 7 pages.

*Primary Examiner* — Dharti H Patel
(74) *Attorney, Agent, or Firm* — Taft Stettinius & Hollister LLP; J. Bruce Schelkopf

(57) ABSTRACT

An arc fault detection arrangement for a DC electric bus, the DC electric bus having one or more electric lines adapted to electrically connect a source section and a load section of an electric apparatus, the arc fault detection arrangement including an arc fault detector adapted to receive and process detection signals indicative of AC currents flowing along the electric lines. The arc fault detection arrangement comprises a current sensing device including: primary winding means including a first primary winding conductors and a second primary winding conductors adapted to be electrically connected in series with source portions and load portions of corresponding first and second line conductors of the electric lines, so that common-mode electric currents flowing along the first and second primary winding conductors generate magnetic fluxes with opposite directions; secondary winding means magnetically coupleable with the first primary winding means, the secondary winding means comprising a first secondary winding conductor electrically connected with the arc fault detector to provide the detection signals to the arc fault detector.

20 Claims, 10 Drawing Sheets

Figure 1:
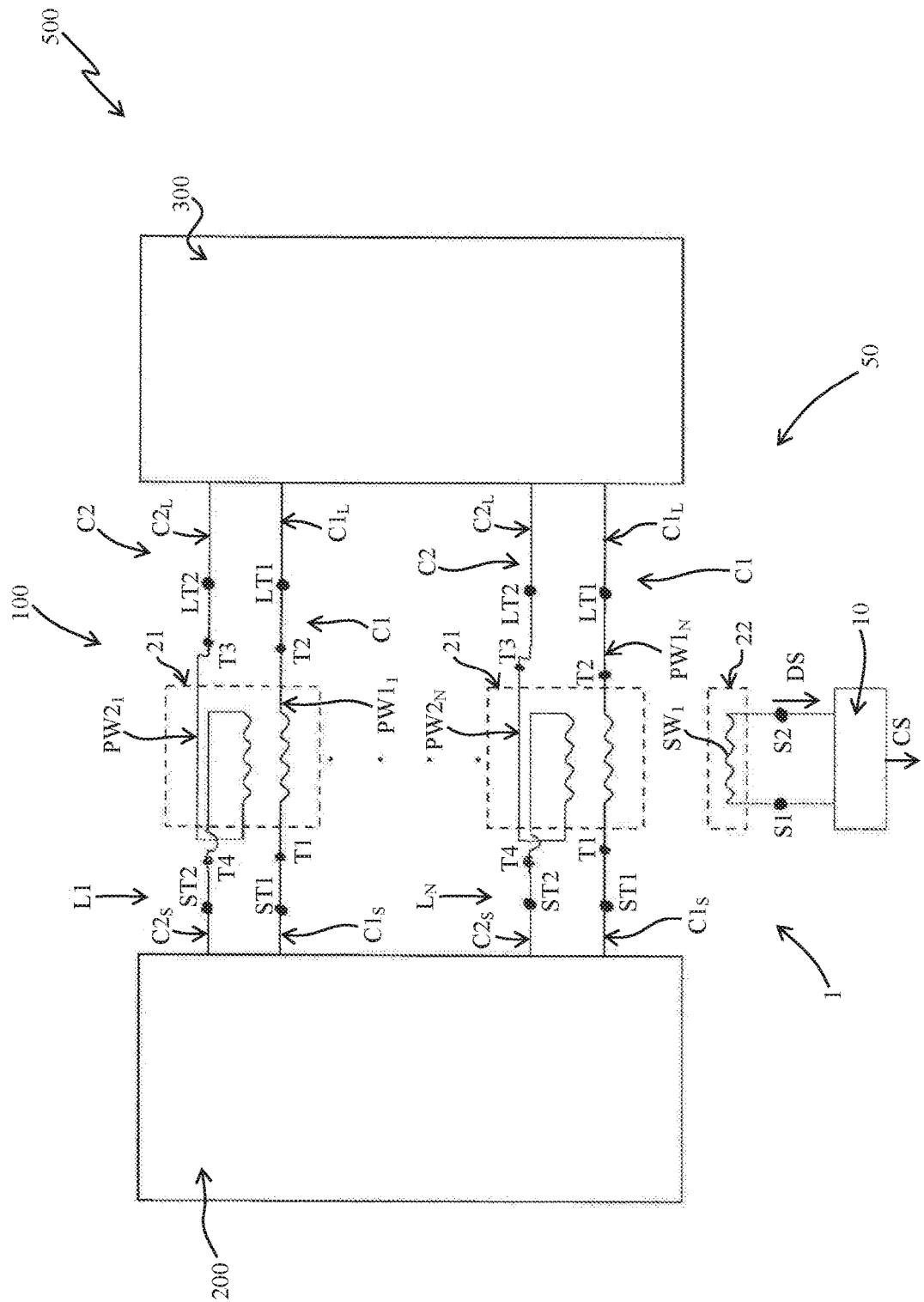

(51) Int. Cl.
- *H02H 3/33* (2006.01)
- *H02S 50/00* (2014.01)
- *G01R 31/50* (2020.01)
- *G01R 31/12* (2020.01)
- *H01H 9/50* (2006.01)
- *H02H 3/04* (2006.01)
- *G01R 15/18* (2006.01)

(52) U.S. Cl.
CPC ............. *H02H 3/044* (2013.01); *H02H 3/33* (2013.01); *H02H 7/20* (2013.01); *H02S 50/00* (2013.01); *G01R 15/18* (2013.01); *Y02E 10/56* (2013.01)

(58) Field of Classification Search
CPC .. G01R 31/025; G01R 15/18; G01R 31/1272; H01H 9/50; Y02E 10/56; H02S 50/00
USPC .......................................................... 361/45
See application file for complete search history.

(56) References Cited

U.S. PATENT DOCUMENTS

2016/0116524 A1* 4/2016 Putz .................... G01R 15/185
                                                            324/537
2018/0048138 A1* 2/2018 Macerini .............. H02H 1/0015

FOREIGN PATENT DOCUMENTS

| WO | 0074192 A1 | 12/2000 |
| WO | 2013049501 AB | 4/2013 |
| WO | 2016001824 A1 | 1/2016 |

* cited by examiner

ARC FAULT DETECTION ARRANGEMENT FOR A DC ELECTRIC BUS

The present invention relates to an arc fault detection arrangement for a DC electric bus. DC electric buses are widely adopted in many types of electric apparatuses, such as, for example, photovoltaic electric power generation systems.

As is known, arc fault detection systems are typically provided to detect arc faults in DC electric buses.

The occurrence of arc faults, in fact, may have severe consequences for the operating life of an electric apparatus.

As an example, arc faults occurring in a photovoltaic electric power generation system (e.g. due to loose connections in a DC electric bus) may lead to fire events in the structure (e.g. the rooftop of a building) on which the photovoltaic panels are installed and may be quite dangerous for the safety of operators and resident people.

A drawback of traditional arc fault detection systems consists in that they are often sensitive to line noise, in particular to noise induced by common mode currents flowing along the electric lines of the DC electric bus. Such a noise sensitivity may lead to errors in detecting possible arc fault events and to consequent undesired tripping of the electric bus.

A further drawback consists in that they have a relatively complex structure, which is often difficult to structurally integrate with other parts or components of the electric apparatus in which they are installed, with a consequent increase of the overall occupied volumes and installation costs.

Finally, these arrangements are often expensive to manufacture at industrial level. The main aim of the present invention is to provide an arc fault detection arrangement for a DC electric bus, which enables the disadvantages described above to be overcome.

Within this aim, another object of the present invention is to provide an arc fault detection arrangement having a high immunity to noise induced by common mode currents flowing along the conductors of the electric lines of the DC electric bus.

Another object of the present invention is to provide an arc fault detection arrangement, which has a particularly simple structure that can be easily installed on the field and easily integrated with other parts or components of the electric apparatus, for which it is designed.

Yet another object of the present invention is to provide an arc fault detection arrangement, which is easy and inexpensive to produce at industrial level and requires a short time for installation on the field.

This aim and these objects, together with other objects that will be more apparent from the subsequent description and from the accompanying drawings, are achieved, according to the invention, by an arc fault detection arrangement, according to claim 1 and to the related dependent claims.

In a further aspect, the present invention related to a photovoltaic electric power generation apparatus, according to the following claim 13.

In yet a further aspect, the present invention related to a current sensing device, according to the following claim 14.

Figure 2:
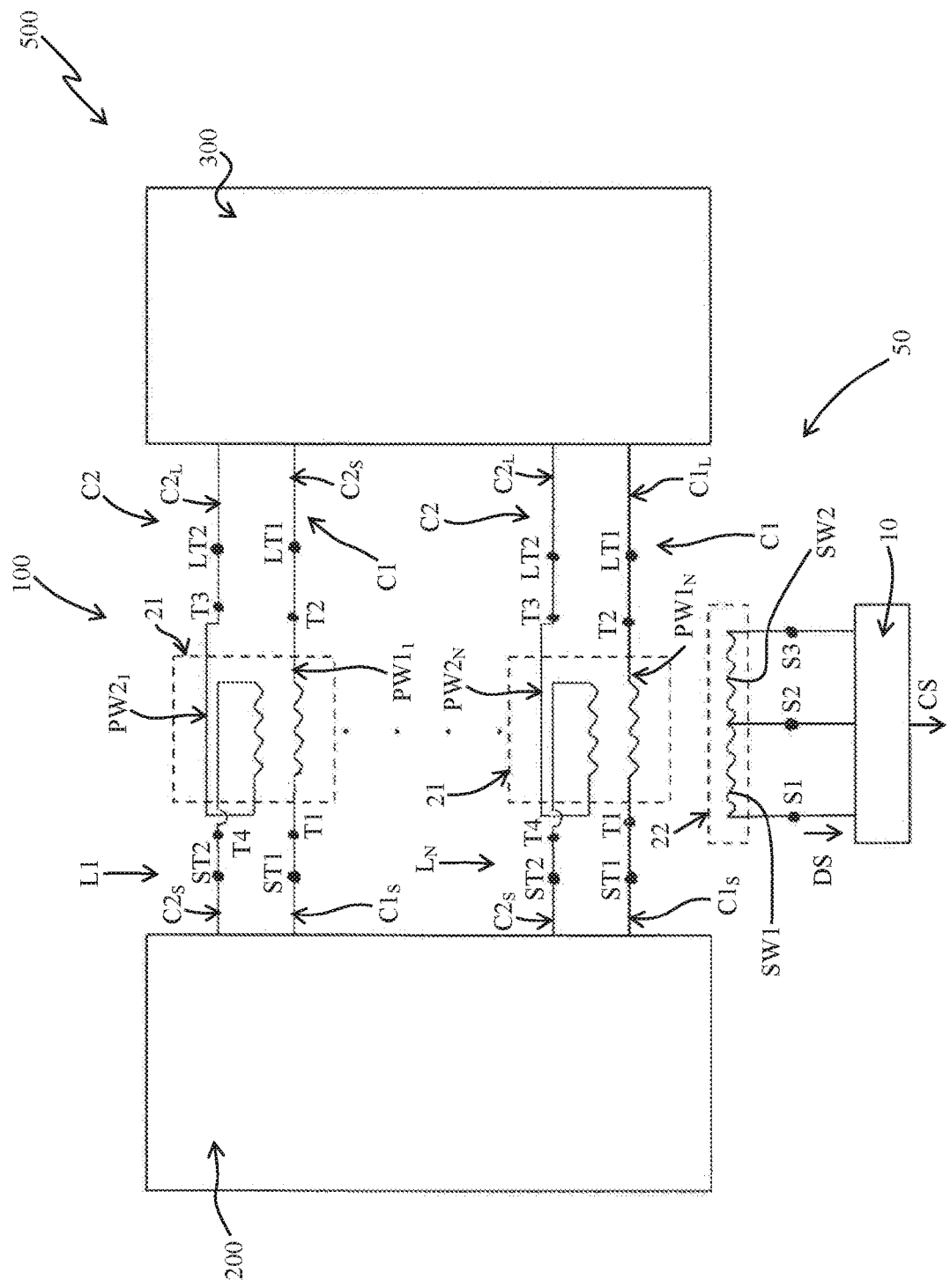
Figure 3:
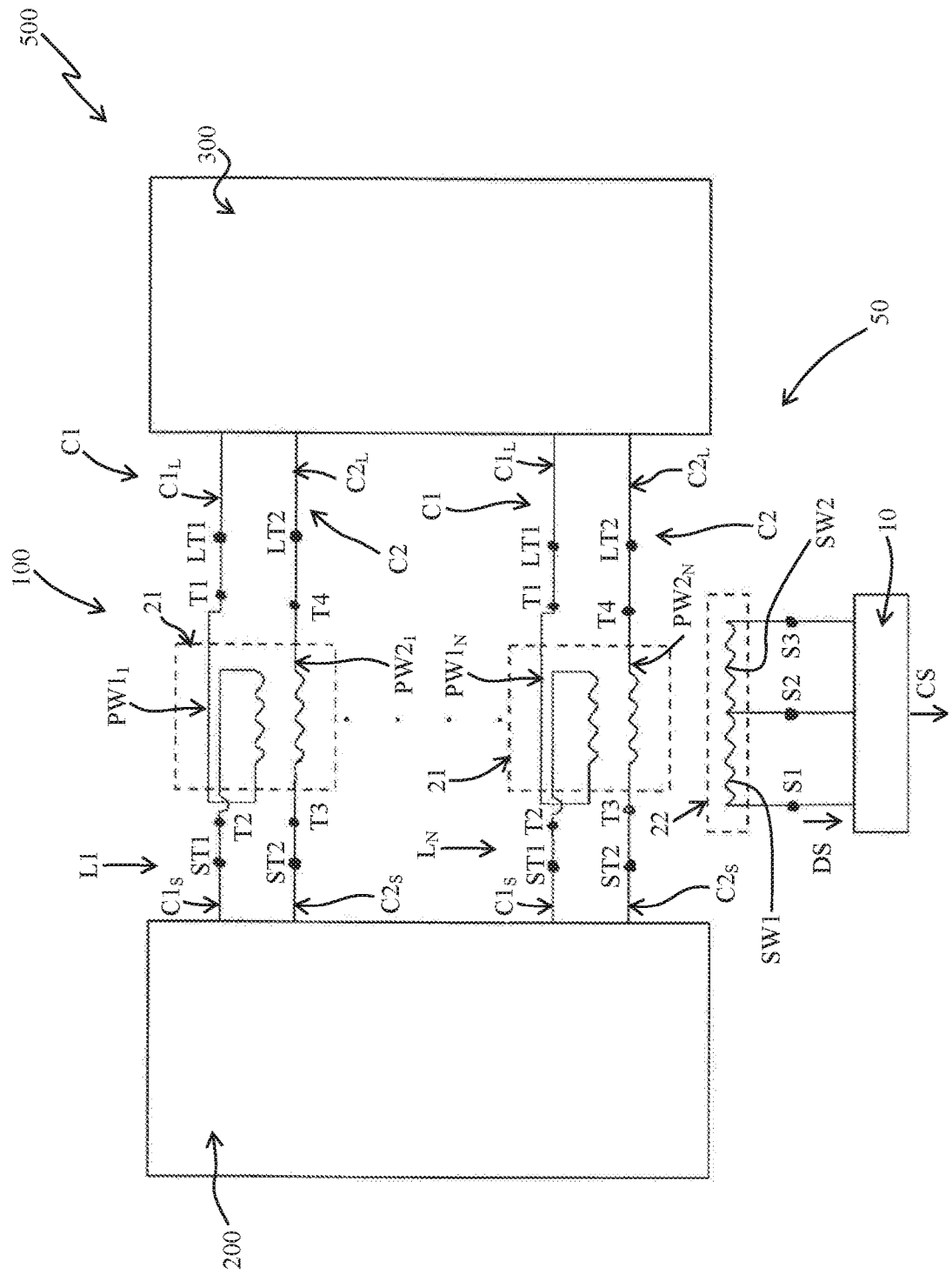
Figure 4:
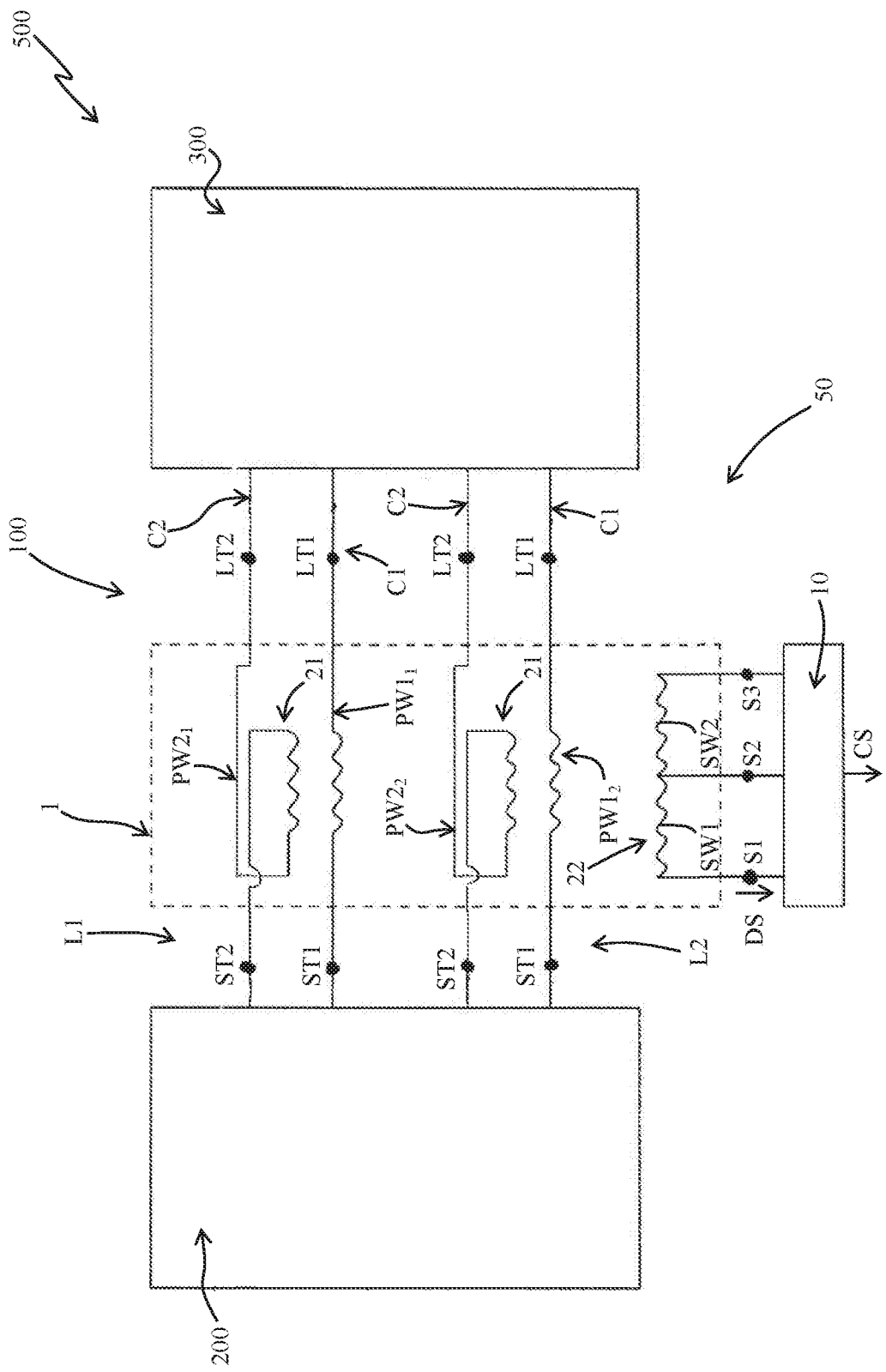
Figure 5:
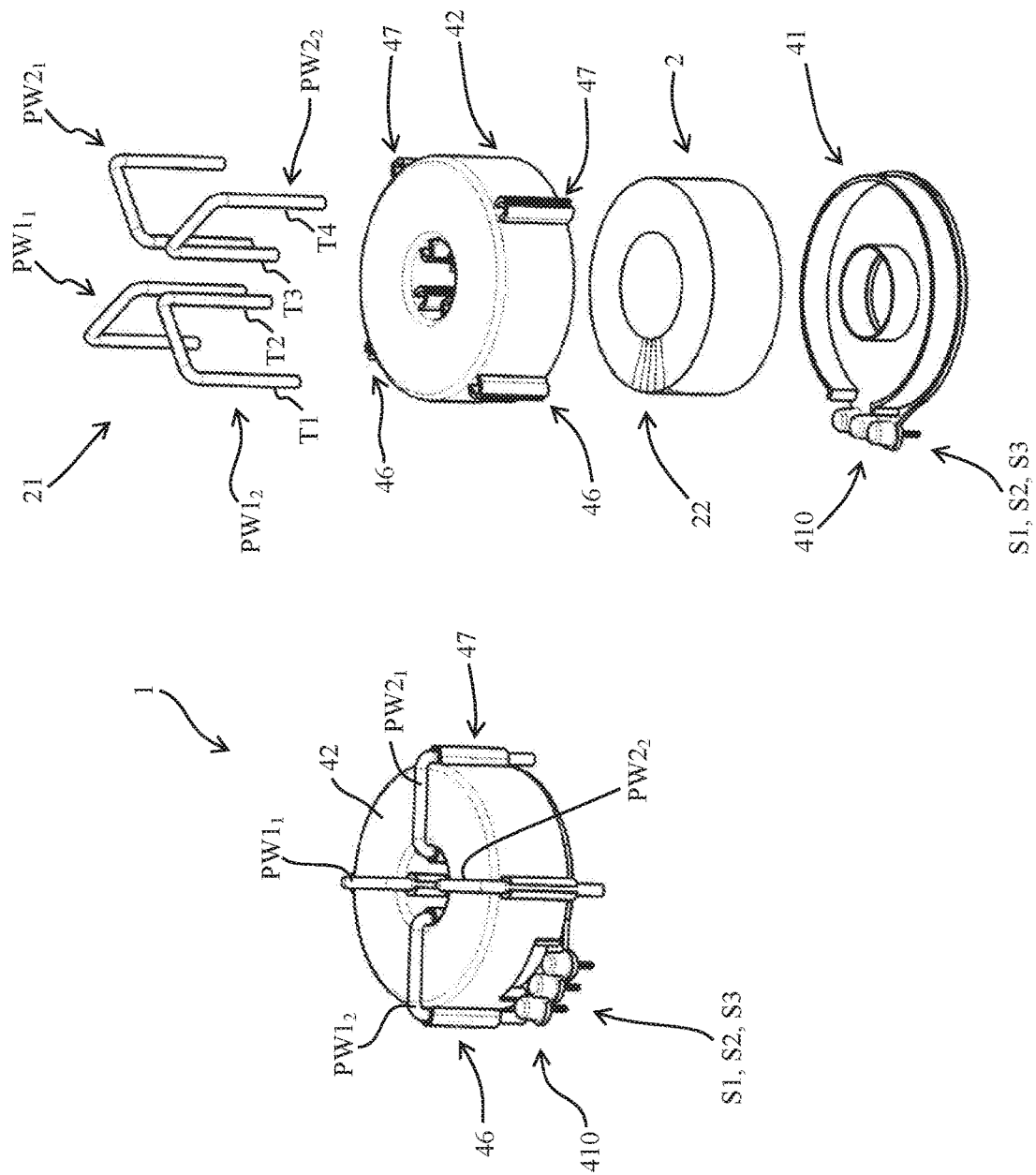
Figure 6:
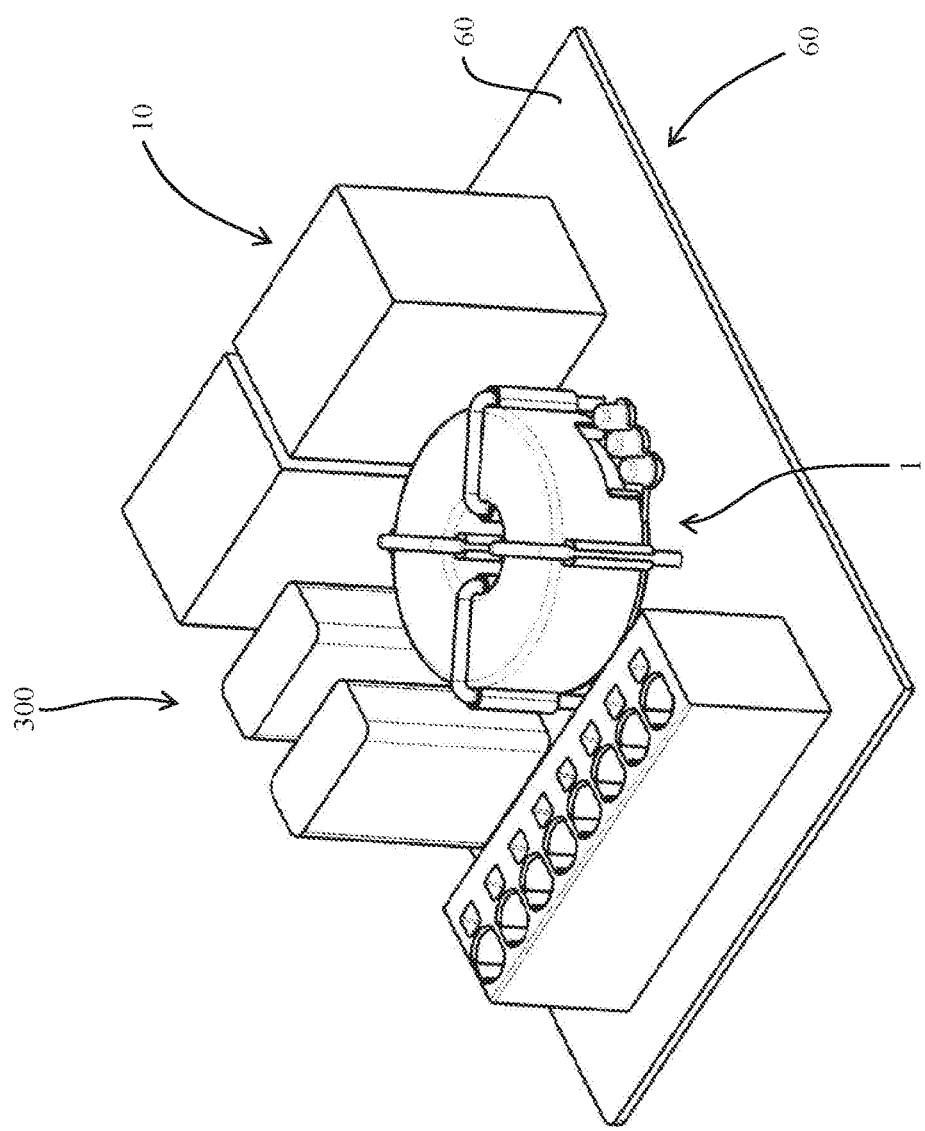
Figure 7:
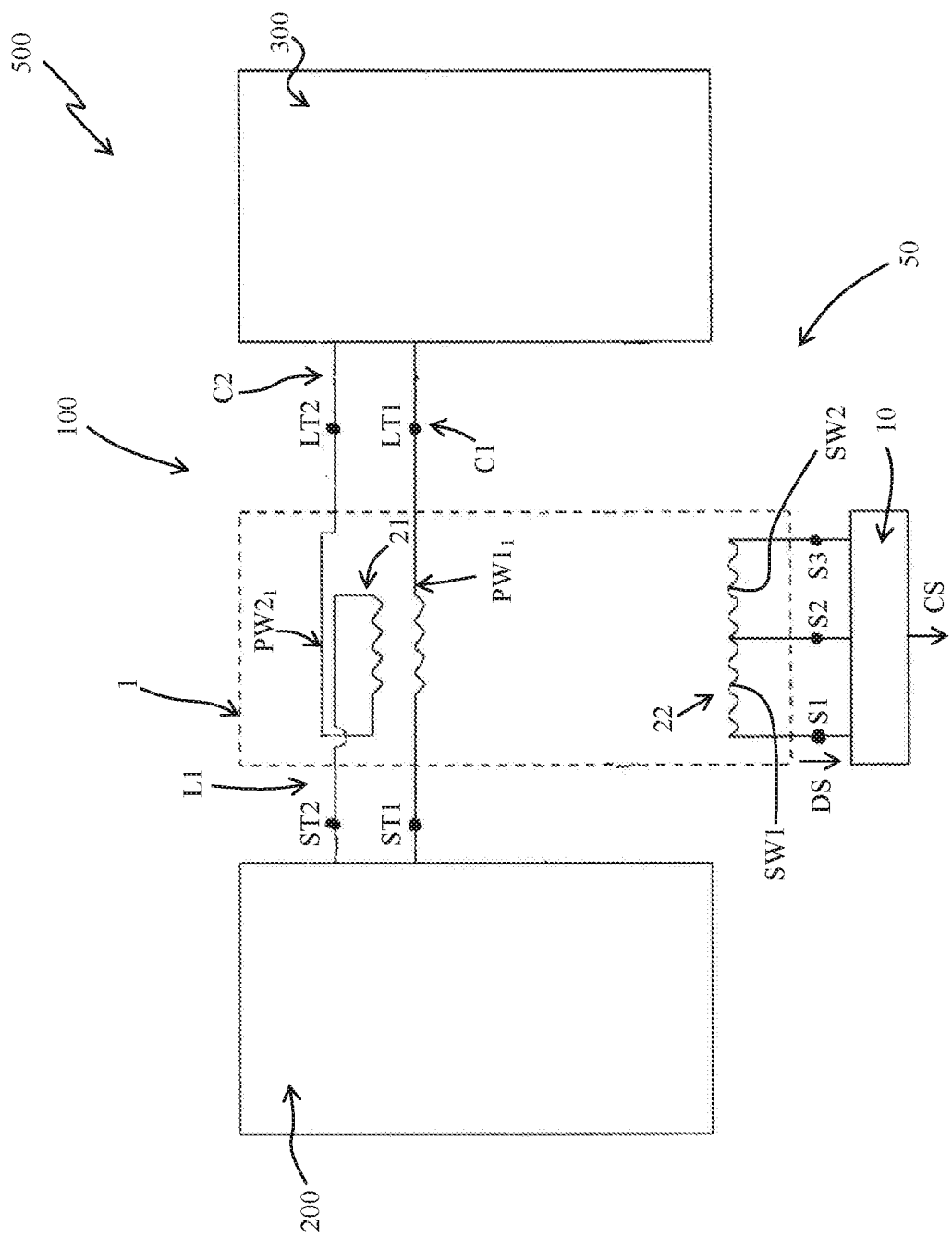
Figure 8:
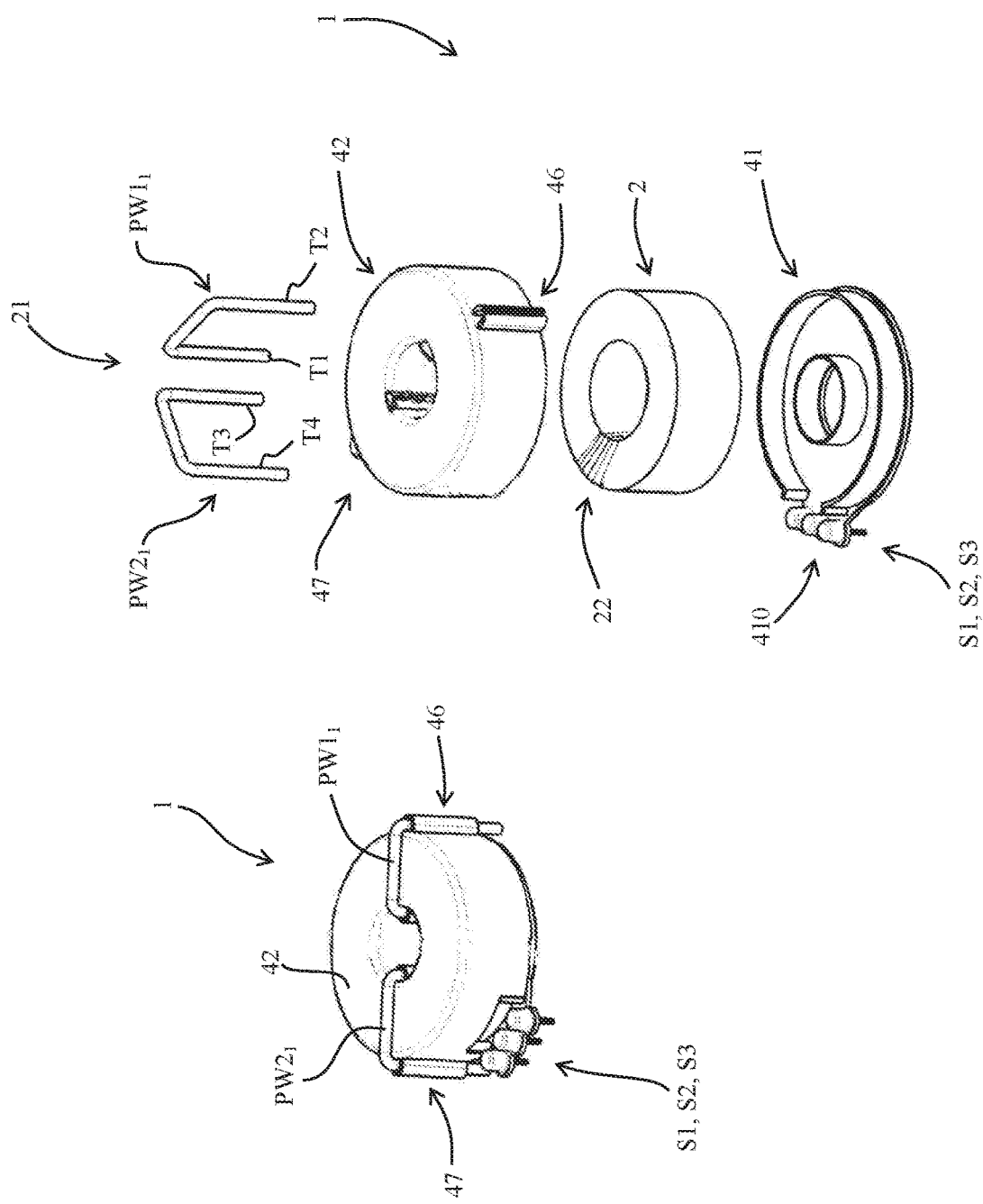
Figure 9:
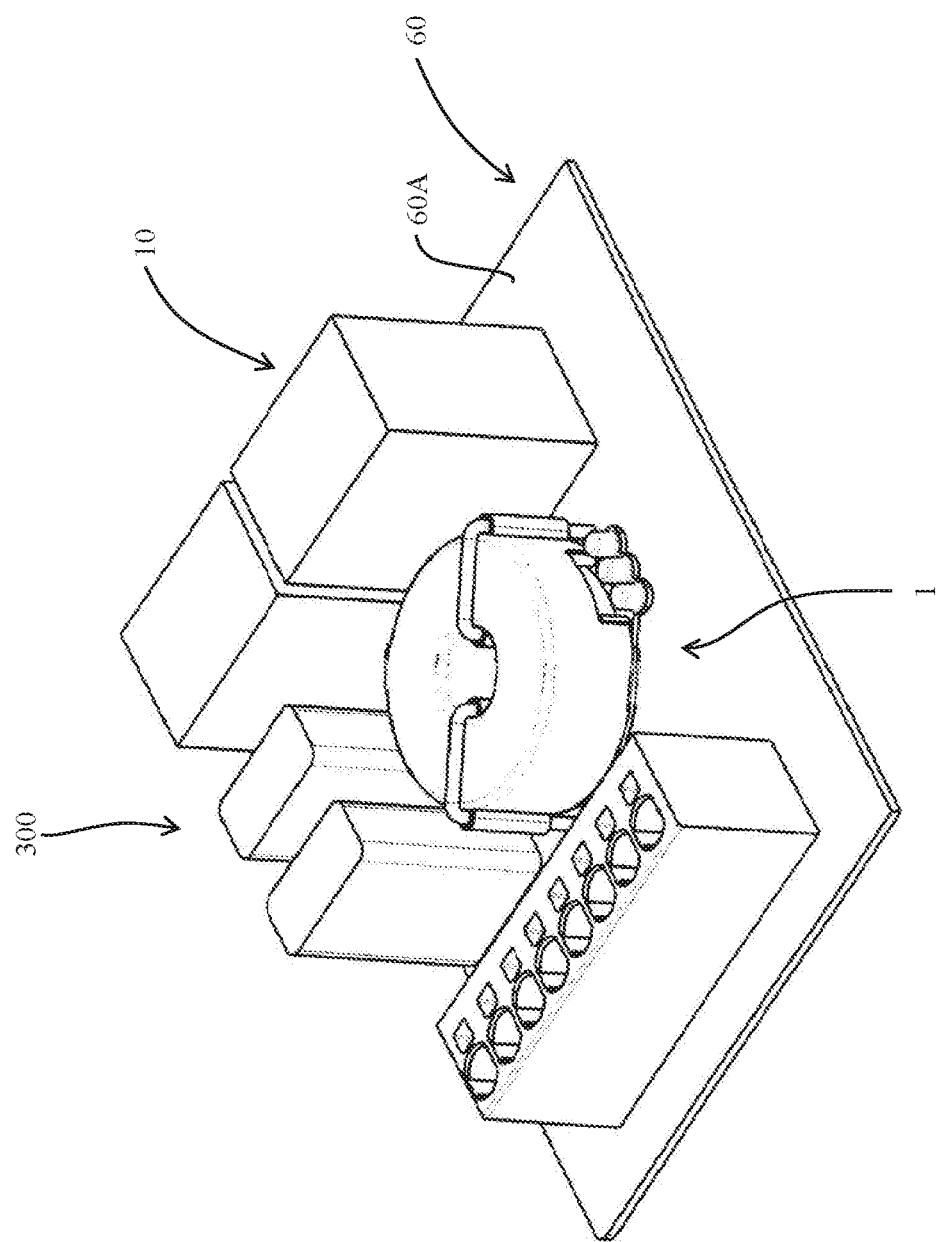
Figure 10:
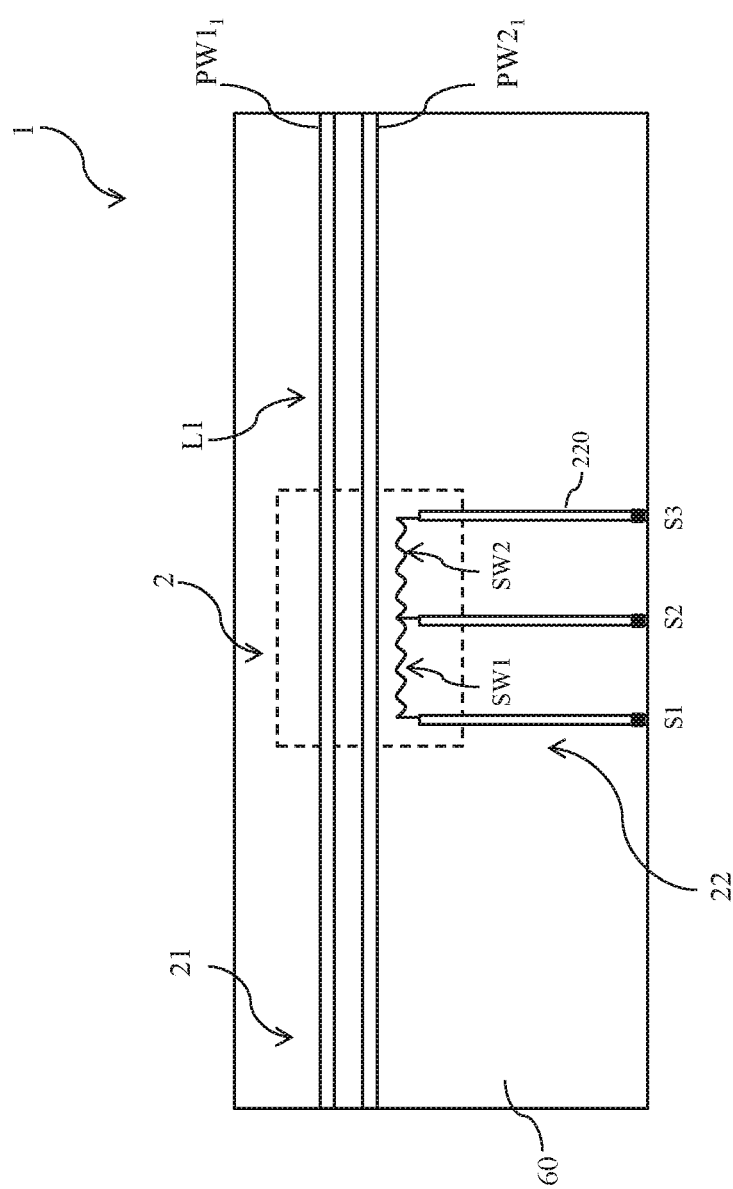

Characteristics and advantages of the present invention will be more apparent with reference to the description given below and to the accompanying figures, provided purely for explanatory and non-limiting purposes, wherein:

FIGS. 1-3 schematically illustrate some embodiments of the arc fault detection arrangement, according to the present invention;

FIGS. 4-6 schematically illustrate a further embodiment of the arc fault detection arrangement, according to the present invention;

FIGS. 7-9 schematically illustrate a further embodiment of the arc fault detection arrangement, according to the present invention;

FIG. 10 schematically illustrates a further embodiment of the arc fault detection arrangement, according to the present invention.

With reference to the aforesaid figures, the present invention relates to an arc fault detection arrangement 50 for a DC electric bus 100 of a low voltage electric apparatus 500.

For the sake of clarity, it is specified that the term "low voltage" refers to operating voltages lower than 1 kV AC and 1.5 kV DC.

In principle, the electric apparatus 500 may be of any type, according to the needs. As an example, it may be a low voltage switchgear or an electric power distribution grid. The arc fault detection arrangement 50 is however particularly suitable for installation in a photovoltaic electric power generation apparatus and will be described with particular reference to this application without intending to limit the scope of the invention.

The electric bus 100 has one or more DC electric lines $L_1, \ldots, L_N$ (N>=1) that electrically connect a source section 200 and a load section 300 of the electric apparatus 500.

As an example, when the electric apparatus 500 is a photovoltaic electric power generation apparatus 500, the source section 200 may be a section including one or more photovoltaic panels and adapted to provide DC electric power, whereas the load section 300 may be a section including an inverter adapted to receive DC electric power and provide AC electric power.

In order to allow the flow of electric currents from the source section 200 to the load section 300, each electric line $L_1, \ldots, L_N$ of the electric bus 100 comprises at least a first conductor C1 (e.g. forming the supply conductor of the respective electric line) and a second conductor C2 (e.g. forming the return conductor of the respective electric line).

The first conductor C1 of each electric line $L_1, \ldots, L_N$ has a first source portion $C1_S$, which is electrically connected with the source section 200 and has a first source terminal $ST_1$, and a first load portion $C1_L$, which is electrically connected with the load section 300 and has a first load terminal $LT_1$.

The second conductor C2 of each electric line $L_1, \ldots, L_N$ has a second source portion $C2_S$, which is electrically connected with the source section 200 and has a second source terminal $ST_2$, and a second load portion $C2_L$, which is electrically connected with the load section 300 and has a second load terminal $LT_2$.

The source portions $C1_S$, $C2_S$ and the load portions $C1_L$, $C2_L$ of each conductor C1, C2 of each electric line $L_1, \ldots, L_N$ are electrically connected in such a way to ensure the electrical continuity between the source and load sections 200 of the apparatus 500.

The apparatus 500 may comprise suitable switching devices (not shown) operatively associated with the conductors of the electric lines $L_1, \ldots, L_N$ to selectively interrupt these latter.

In normal operation of the electric bus 100, DC currents (load currents) flow along the conductors of the electric lines $L_1, \ldots, L_N$.

However, also AC noise currents may flow along the conductors of the electric lines $L_1, \ldots, L_N$ (overlapped with said load currents). Such noise currents, which generally have a well-defined spectral content, are normally generated by electric or electronic components included in the source and load sections 200, 300 of the electric apparatus 500.

When an arc fault occurs, AC arc currents flow along the conductors of the electric lines $L_1, \ldots, L_N$ (overlapped with said load currents and said noise currents). Such arc currents, which generally have a broad band spectral content (pink noise), are normally generated due to the turbulences of the arc plasma formed during the arc fault and due to other factors linked to the occurring arc phenomenon.

Of course, the electrical currents (DC or AC) flowing along the conductors of the electric lines $L_1, \ldots, L_N$ may be of common-mode type or differential-mode type.

The arc fault detection arrangement 50 of the invention is directed to detect the AC currents flowing along the conductors of the electric lines $L_1, \ldots, L_N$ and determine whether said currents include arc currents indicative of the occurrence of an arc fault.

It is evidenced that the sole differential mode AC currents, which flow along the conductors of the electric lines $L_1, \ldots, L_N$, represent the useful physical quantities to be sensed for arc fault detection purposes. On the contrary, common-mode AC currents (whatever the type) represent signal disturbances to be eliminated or remarkably reduced.

According to the invention, the arc fault detection arrangement 50 comprises an arc fault detector 10 adapted to receive and process detection signals DS indicative of the AC currents (e.g. the noise currents and possibly the arc currents overlapped to the DC load currents) flowing along the electric lines $L_1, \ldots, L_N$ in order to detect the occurrence of an arc fault in said electric lines.

Preferably, the arc fault detector 10 is adapted to process the detection signals DS, which are indicative of the AC currents flowing along the electric lines $L_1, \ldots, L_N$, and determine the presence of possible arc currents (which are thus indicative of incoming or occurring arc faults) by selectively identifying these latter on the first of their spectral content.

Preferably, the arc fault detector 10 provides control signals CS indicative of the presence of an arc fault in the electric lines $L_1, \ldots, L_N$ of the Electric bus 10. The control signals CS may be sent to other control devices and/or directly to the switching devices adapted to interrupt the electric lines $L_1, \ldots, L_N$.

The arc fault detector 10 may be a device of known type and will not be further described for the sake of brevity.

According to the invention, the arc fault detection arrangement 50 comprises a current sensing device 1 adapted to detect the AC currents flowing along the electric lines $L_1, \ldots, L_N$ and provide the detection signals DS to the arc fault detection 10.

In general, the current sensing device 1 is configured as an amperometric transformer (configured as magnetic coil or as a Rogowski coil) having a single magnetic circuit that is enchained with the electric lines $L_1, \ldots, L_N$.

The magnetic circuit 2 may be formed by one or more shaped pieces of magnetic material (magnetic core).

Such pieces of magnetic material may be arranged to form one or more airgaps along the magnetic circuit 2 or may be formed by a magnetic material having a relatively low magnetic permeability.

As an alternative, the magnetic circuit 2 may be formed by one or more shaped pieces of non-magnetic material (Rogowski coil with non-magnetic core).

Such pieces of non-magnetic material may be arranged to form one or more airgaps along the magnetic circuit 2

As a further alternative, the magnetic circuit 2 may be a magnetic flux path fully realized in air (Rogowski coil in air).

Preferably, the magnetic circuit 2 has a relative magnetic permeability lower than or equal to 150.

This solution allow avoiding or reducing the occurrence of saturation phenomena of the magnetic circuit caused by the relative high DC current flowing along the conductors of the electric lines $L_1, \ldots, L_N$.

Preferably, the magnetic circuit 2 is formed by a core having a toroidal structure.

The sensing device 1 comprises primary winding means 21 operatively associated with the magnetic circuit 2.

The primary winding means 21 comprise one or more first primary winding conductors $PW1_1, \ldots, PW1_N$ and one or more second primary winding conductors $PW2_1, \ldots, PW2_N$, which are enchained with the magnetic circuit 2.

Each first primary winding conductor $PW1_1, \ldots, PW1_N$ is adapted to be electrically connected in series with a source portion $C1_S$ and a load portions $C1_L$ of a respective first line conductor C1 of a corresponding electric line $L_1, \ldots, L_N$.

Each second primary winding conductor $PW2_1, \ldots, PW2_N$ is adapted to be electrically connected in series with a source portion $C2_S$ and a load portions $C2_L$ of a respective second line conductor C2 of a corresponding electric line $L_1, \ldots, L_N$.

In practice, when the current sensing device is installed, each first primary winding conductor $PW1_1, \ldots, PW1_N$ has positive and negative (in terms of voltage applied thereto) terminals $T_1$, $T_2$ electrically connected with the terminals $ST_1$, $LT_1$ of the source and load portions $C1_S$, $C1_L$ of a respective first line conductor C1 of a corresponding electric line $L_1, \ldots, L_N$, whereas each second primary winding conductor $PW2_1, \ldots, PW2_N$ has positive and negative (in terms of voltage applied thereto) terminals $T_3$, $T_4$ electrically connected with the terminals $ST_2$, $LT_2$ of the source and load portions $C2_S$, $C2_L$ of a respective second line conductor C2 of a corresponding electric line $L_1, \ldots, L_N$.

In this way, a single magnetic circuit 2 is enchained with the electric lines $L_1, \ldots, L_N$ (more precisely at least with the first and second conductors C1, C2 of these latter).

The AC currents flowing along the first and second line conductors C1, C2 of the electric lines $L_1, \ldots, L_N$ circulate along the first and second primary winding conductors $PW1_1, \ldots, PW1_N, PW2_1, \ldots, PW2_N$ and generate a magnetic flux that circulates along the magnetic circuit 2.

According to some embodiments of the invention, the first and/or second primary winding conductors $PW1_1, \ldots, PW1_N, PW2_1, \ldots, PW2_N$ are formed by corresponding rigid conductive elements arranged on a support.

According to some embodiments of the invention, the first and/or second primary winding conductors $PW1_1, \ldots, PW1_N, PW2_1, \ldots, PW2_N$ are formed by corresponding conductive tracks arranged on a support.

The sensing device 1 comprises secondary winding means 22, which are magnetically coupleable with the primary winding means 21 through the magnetic circuit 2.

The secondary winding means 22 comprise at least a first secondary winding conductor SW1.

When a magnetic flux circulates along said magnetic circuit, a secondary current flows along the first secondary winding conductor SW1. Such a secondary current is indicative of the AC currents that have generated such a magnetic flux.

Preferably, the first secondary winding conductor SW1 is electrically connected (at its terminals S1, S2) with the arc fault detector 10.

In this way, the mentioned secondary currents flowing along the first secondary winding conductor SW1 represents the detection signals DS provided to the arc fault detector 10.

In some embodiments of the invention (not shown), however, the secondary winding means 22 may comprise an interface circuit electrically connected between the terminals S1, S2 of the first secondary winding conductor SW1 and the arc fault detector 10. Such an interface circuit may be configured to receive the secondary currents circulating along the first secondary winding conductor SW1 and provide the detection signals DS to the arc fault detector 10. In this case, such a detection signals DS may be a voltage signal.

In some embodiments of the invention, the secondary winding means 22 comprise at least a second secondary winding conductor SW2 enchained with the magnetic circuit 2 (FIGS. 2, 3).

The second secondary winding conductor SW2 is electrically connected (at its terminals S2, S3) with the arc fault detector 10 to receive a test current from this latter.

When circulating along the second secondary winding conductor SW2, such a test current generates a magnetic flux that circulates along the magnetic circuit 2.

As said magnetic flux results enchained with the first secondary winding conductor SW1, a secondary current of known amplitude is expected to flow along this latter.

As it may be easily understood, it is thus possible to easily carry out self-test sessions to check the operation of the current sensing device 1 and of the arc fault detector 10.

According to some embodiments of the invention, the first and/or second secondary winding conductors $SW1_1$, SW2 are formed by corresponding rigid conductive elements arranged on a support.

In the embodiments shown in the cited figures, the second secondary winding conductor SW2 has a terminal (S2) in common with the first secondary winding conductor SW1.

This solution facilitates the arrangement of the secondary means 22 and the connection of these latter with the arc fault detector 10.

According to the invention, the first and second primary winding conductors $PW1_1, \ldots, PW1_N, PW2_1, PW2_N$ are adapted to be electrically connected in series with the source portions $C1_S$, $C2_S$ and the load portions $C1_L$, $C2_L$ of the corresponding first and second line conductors C1, C2 of the electric lines L1, . . . , LN in such a way that common-mode electric currents flowing along the first and second primary winding conductors $PW1_1, \ldots, PW1_N, PW2_1, \ldots, PW2_N$ generate magnetic fluxes having opposite directions.

In other words, when the current sensing device is installed, the first and second primary winding conductors $PW1_1, \ldots, PW1_N, PW2_1, \ldots, PW2_N$ are electrically connected to the source portions $C1_S$, $C2_S$ and the load portions $C1_L$, $C2_L$ of the corresponding first and second line conductors C1, C2 with mutually opposite polarities.

According to a possible connection arrangement (FIGS. 1-2):
the first primary winding conductors $PW1_1, \ldots, PW1_N$ have positive terminals T1 electrically connected with the corresponding source terminals $ST_1$ of the source portions $C1_S$ of the first conductors C1 and negative terminals T2 electrically connected with the corresponding load terminals $LT_1$ of the load portions $C1_L$ of the first conductors C1;
the second primary winding conductors $PW2_1, \ldots, PW2_N$ have positive terminals T3 electrically connected with the corresponding load terminals $LT_2$ of the load portions $C2_L$ of the second conductors C2 and negative terminals T4 electrically connected with the corresponding source terminals $ST_2$ of the source portions $C2_S$ of the second conductors C2.

According to a possible alternative connection arrangement (FIG. 3):
the first primary winding conductors $PW1_1, \ldots, PW1_N$ have positive terminals T1 electrically connected with the corresponding load terminals $LT_1$ of the load portions $C1_L$ of the first conductors C1 and negative terminals T2 electrically connected with the corresponding source terminals $ST_1$ of the source portions $C1_S$ of the first conductors C1;
the second primary winding conductors $PW2_1, \ldots, PW2_N$ have positive terminals T3 electrically connected with the corresponding source terminals $ST_2$ of the source portions $C2_S$ of the second conductors C2 and negative terminals T4 electrically connected with the corresponding load terminals $LT_2$ of the load portions $C2_L$ of the second conductors C2.

The technical solution provided by the present invention allows cancelling or remarkably reducing the disturbances, which are induced by the common mode AC currents flowing along the conductors of the electric lines $L_1, \ldots, L_N$, on the detection signals DS.

In fact, for each electric line, the magnetic fluxes generated by these currents are mutually compensated thanks to the physical layout (e.g. according to the connection arrangements described above) provided for the primary winding conductors $PW1_1, \ldots, PW1_N, PW2_1, \ldots, PW2_N$ in relation to the respective conductors of said electric lines.

The detection signals DS provided by current sensing device 1 thus result as indicative of the sole differential mode AC currents flowing along the conductors of the electric lines $L_1, \ldots, L_N$, which represent, as mentioned above, the useful physical quantities to be sensed for arc fault detection purposes.

In FIG. 1, a possible embodiment of the arc fault detection arrangement 50 is shown.

The arc fault detection arrangement 50 comprises a current sensing device 1 having a single magnetic circuit 2.

The current sensing device 1 has primary winding means 21 including a plurality of first primary conductors $PW1_1, \ldots, PW1_N$ electrically connected in series with the source and load portions $C1_S$, $C1_L$ of the first conductors C1 and a plurality of second primary conductors $PW2_1, \ldots, PW2_N$ electrically connected in series with the source and load portions $C2_S$, $C2_L$ of the second conductors C2.

A single magnetic circuit is thus enchained with both the first and second conductors C1, C2 of the electric line $L_1, \ldots, L_N$.

The first and second primary winding conductors $PW1_1, \ldots, PW1_N, PW2_1, \ldots, PW2_N$ are electrically connected to the source portions $C1_S$, $C2_S$ and the load portions $C1_L$, $C2_L$ of the corresponding first and second line conductors C1, C2 with opposite polarities.

The current sensing device 1 has secondary winding means 22 including the sole first secondary winding conductor SW1, which is electrically connected (at its terminals S1, S2) with an arc fault detector 10.

In FIG. 2, a further possible embodiment of the arc fault detection arrangement 50 is shown.

The arc fault detection arrangement 50 comprises a current sensing device 1 having a single magnetic circuit 2.

The current sensing device 1 has primary winding means 21 including a plurality of first primary conductors $PW1_1, \ldots, PW1_N$ electrically connected in series with the source and load portions $C1_S$, $C1_L$ of the first conductors C1 and a plurality of second primary conductors $PW2_1, \ldots, PW2_N$ electrically connected in series with the source and load portions $C2_S$, $C2_L$ of the second conductors C2.

A single magnetic circuit is thus enchained with both the first and second conductors C1, C2 of the electric line $L_1, \ldots, L_N$.

The first and second primary winding conductors $PW1_1, \ldots, PW1_N, PW2_1, \ldots, PW2_N$ are electrically connected to the source portions $C1_S$, $C2_S$ and the load portions $C1_L$, $C2_L$, of the corresponding first and second line conductors C1, C2 with opposite polarities.

The current sensing device 1 has secondary winding means 22 including the first secondary winding conductor SW1 and the second secondary winding conductor SW2, which have a terminal S2 in common.

The terminals S1, S2, S3 of the secondary winding conductors SW1, SW2 are electrically connected with an arc fault detector 10.

In FIG. 3, a further possible embodiment of the arc fault detection arrangement 50 is shown.

The arc fault detection arrangement 50 comprises a current sensing device 1 having a single magnetic circuit 2.

The current sensing device 1 has primary winding means 21 including a plurality of first primary conductors $PW1_1, \ldots, PW1_N$ electrically connected in series with the source and load portions $C1_S$, $C1_L$ of the first conductors C1 and a plurality of second primary conductors $PW2_1, \ldots, PW2_N$ electrically connected in series with the source and load portions $C2_S$, $C2_L$ of the second conductors C2.

A single magnetic circuit is thus enchained with both the first and second conductors C1, C2 of the electric line $L_1, \ldots, L_N$.

The first and second primary winding conductors $PW1_1, \ldots, PW1_N, PW2_1, \ldots, PW2_N$ are electrically connected to the source portions $C1_S$, $C2_S$ and the load portions $C1_L$, $C2_L$, of the corresponding first and second line conductors C1, C2 with opposite polarities, which are reversed with respect to the embodiments illustrated in FIGS. 1-2.

The current sensing device 1 has secondary winding means 22 including the first secondary winding conductor SW1 and the second secondary winding conductor SW2, which have a terminal S2 in common.

The terminals S1, S2, S3 of the secondary winding conductors SW1, SW2 are electrically connected with an arc fault detector 10.

In FIG. 4, a further possible embodiment of the arc fault detection arrangement 50 is shown.

This embodiment is a variant of the one shown in FIG. 2, which has been designed for an electric bus 100 having only two electric lines $L_1$, $L_2$, each having a first conductor C1 (e.g. forming the supply conductor of the respective electric line) and a second conductor C2 (e.g. forming the return conductor of the respective electric line).

The arc fault detection arrangement 50 comprises a current sensing device 1 having a single magnetic circuit 2.

The current sensing device 1 has primary winding means 21 including two first primary conductors $PW1_1$, $PW1_2$ electrically connected in series with the source and load portions $C1_S$, $C1_L$ of the first conductors C1 and two second primary conductors $PW2_1$, $PW2_2$ electrically connected in series with the source and load portions $C2_S$, $C2_L$ of the second conductors C2.

The first and second primary winding conductors $PW1_1$, $PW1_2$, $PW2_1$, $PW2_2$ are electrically connected to the source portions $C1_S$, $C2_S$ and the load portions $C1_L$, $C2_L$ of the corresponding first and second line conductors C1, C2 with opposite polarities.

The current sensing device 1 has secondary winding means 22 including the first secondary winding conductor SW1 and the second secondary winding conductor SW2, which have a terminal S2 in common.

The terminals S1, S2, S3 of the secondary winding conductors SW1, SW2 are electrically connected with an arc fault detector 10.

In FIG. 7, a further possible embodiment of the arc fault detection arrangement 50 is shown.

This embodiment is a further variant of the one shown in FIG. 2, which has been designed for an electric bus 100 having a single electric line $L_1$ having a first conductor C1 (e.g. forming the supply conductor of the respective electric line) and a second conductor C2 (e.g. forming the return conductor of the respective electric line).

The arc fault detection arrangement 50 comprises a current sensing device 1 having a single magnetic circuit 2.

The current sensing device 1 has primary winding means 21 including the first primary conductor $PW1_1$ electrically connected in series with the source and load portions $C1_S$, $C1_L$ of the first conductor C1 of the electric lines $L_1$ and the second primary conductor $PW2_1$ electrically connected in series with the source and load portions $C2_S$, $C2_L$ of the second conductor C2 of the electric lines $L_1$.

The first and second primary winding conductors $PW1_1$, $PW2_1$ are electrically connected to the source portions $C1_S$, $C2_S$ and the load portions $C1_L$, $C2_L$ of the corresponding first and second line conductors C1, C2 with opposite polarities.

The current sensing device 1 has secondary winding means 22 including the first secondary winding conductor SW1 and the second secondary winding conductor SW2, which have a terminal S2 in common.

The terminals S1, S2, S3 of the secondary winding conductors SW1, SW2 are electrically connected with an arc fault detector 10.

It is evident that further embodiments of the arc fault detection arrangement 50, the layout of which may depend on the configuration of the electric bus 100, are possible and within the capacity of the skilled person.

According to some embodiments of the invention, the currents sensing device 1 may be advantageously arranged so as to be mountable on a support 60, which may be, for example, a PCB.

This solution greatly facilitates the structural integration of the current sensing device 1 with components or parts of the electric apparatus 50 without a substantial increase of the occupied volumes.

As an example, when the electric apparatus 500 is a photovoltaic electric power generation apparatus 500, the current sensing device 1 may be mounted on the main board 60 of an inverter included in the load section 300.

According to possible embodiments of the invention, the current sensing device 1 comprises an outer enclosure 4 mechanically fixable to a support 60 (e.g. a PCB) and adapted to define a volume, in which a core, which forms the magnetic circuit 2, and the secondary winding means 22 of the current sensing device are accommodated.

Preferably, the outer enclosure 4 comprises a first portion 41 and a second portion 42 mechanically coupleable one to another (e.g. by means of a snap-fit or a press-fit connection). When the core 2 is toroidal, the outer enclosure 4 may be fixed to the support in such a way that the symmetry axis passing through the toroidal core 2 is perpendicular to a mounting surface 60A of the support 60 (horizontal mounting of the core 2). In practice, according to this mounting arrangement, the toroidal core 2 is oriented along a plane parallel to the support 60.

As an alternative, when the core 2 is toroidal, the outer enclosure 4 may be fixed to the support in such a way that the symmetry axis passing through the toroidal core 2 is parallel to a mounting surface 60A of the support 60 (vertical mounting of the core 2). In practice, according to this mounting arrangement, the toroidal core 2 is oriented along a plane perpendicular to the support 60.

The current sensing device 1 comprises one or more first conductive bridges $PW1_1$, $PW1_2$ forming the first primary winding conductors of the current sensing device 1.

The first rigid conductive bridges $PW1_1$, $PW1_2$ are arranged externally to the outer enclosure 4 and are coupleable with the support 60, preferably at their ends T1, T2.

The first conductive bridges $PW1_1$, $PW1_2$ are shaped so as to be at least partially wound around the core 2 when they are operatively coupled (i.e. mechanically fixed and electrically connected) with the support 60.

In practice, the first conductive bridges $PW1_1$, $PW1_2$ are arranged so as to form a conductive path that is at least partially enchained with the core, so that possible AC currents flowing along the $PW1_1$, $PW1_2$ generate a magnetic flux that circulates along the core 2.

When the core 2 has a toroidal structure, as shown in FIGS. 5-6 and 8-9, the first conductive bridges $PW1_1$, $PW1_2$ are substantially U-shaped and have first and second leg portions respectively passing through and out of the core 2 and directed towards the support 60, in such a way that their ends T1, T2 can be coupled with the support 60.

Preferably, the first conductive bridges $PW1_1$, $PW1_2$ are structurally rigid.

Preferably, the enclosure 4, in particular the second portion 41 thereof, comprises first retaining means 46 adapted to be removably coupled with the first conductive bridges $PW1_1$, $PW1_2$.

Preferably, the first retaining means 46 comprise first deformable protrusions of the enclosure 4, in particular of the second portion 41 thereof, which are shaped so as to fit with the first conductive bridges $PW1_1$, $PW1_2$, in particular with leg portions thereof, and couple with said bridges by means of mechanical coupling of the snap-fit or press-fit type.

The current sensing device 1 comprises also one or more second conductive bridges $PW2_1$, $PW2_2$ forming the second primary winding conductors of the current sensing device 1.

The second conductive bridges $PW2_1$, $PW2_2$ are arranged externally to the outer enclosure 4 and are coupleable with the support 60, preferably at their ends T3, T4.

The second conductive bridges $PW2_1$, $PW2_2$ are shaped so as to be partially wound around the core 2 when they are operatively coupled (i.e. mechanically fixed and electrically connected) with the support 60.

When the core 2 has a toroidal structure, the second conductive bridges $PW2_1$, $PW2_2$ are substantially U-shaped and have first and second leg portions respectively passing through and out of the core 2 and directed towards the support 60, in such a way that their ends T3, T4 can be coupled with the support 60.

Preferably, the second conductive bridges $PW2_1$, $PW2_2$ are structurally rigid.

Preferably, the enclosure 4, in particular the second portion 41 thereof, comprises second retaining means 47 adapted to be removably coupled with the second conductive bridges $PW2_1$, $PW2_2$.

Preferably, the second retaining means 47 comprise second deformable protrusions of the enclosure 4, in particular of the second portion 41 thereof, which are shaped so as to fit with the second conductive bridges $PW2_1$, $PW2_2$, in particular with leg portions thereof, and couple with said bridges by means of mechanical coupling of the snap-fit or press-fit type.

In FIGS. 5-6, an example of the current sensing device 1 is shown.

In this case, the current sensing device 1 is designed for an arc fault detection arrangement configured according to the embodiment shown in FIG. 4.

The current sensing device 1 comprises an outer enclosure 4 accommodating a toroidal core forming the magnetic circuit 2 and the secondary winding means 22 of the current sensing device.

The outer enclosure 4 comprises the first portion 41 mechanically fixed to the support 60 and the second portion 42 mechanically coupled with the first portion 41 (horizontal mounting of the core 2).

The first portion 41 comprises the output sub-portion 410 accommodating the terminals S1, S2, S3 of the secondary winding conductors SW1, SW2 of the secondary winding means 22.

The current sensing device 1 comprises the first rigid conductive bridges $PW1_1$, $PW1_2$ forming the first primary winding conductors of the current sensing device 1.

The first rigid conductive bridges $PW1_1$, $PW1_2$ are arranged externally to the outer enclosure 4.

The first conductive bridges $PW1_1$, $PW1_2$ are U-shaped and have their leg portions respectively passing through and out of the core 2 and directed towards the support 60, in such a way to be coupled with the support 60 at the ends T1, T2.

The second portion 41 of the enclosure 4 comprises first deformable protrusions 46 removably coupled with leg portions of the first conductive bridges $PW1_1$, $PW1_2$.

The current sensing device 1 comprises also the second rigid conductive bridges $PW2_1$, $PW2_2$ forming the second primary winding conductors of the current sensing device 1.

The second rigid conductive bridges $PW2_1$, $PW2_2$ are arranged externally to the outer enclosure 4, in parallel one to another and with the first rigid conductive bridges $PW1_1$, $PW1_2$.

The second conductive bridges $PW2_1$, $PW2_2$ are U-shaped and have their leg portions respectively passing through and out of the core 2 and directed towards the support 60, in such a way to be coupled with the support 60 at the ends T3, T4.

The second portion 41 of the enclosure 4 comprises second deformable protrusions 47 removably coupled with the leg portions of the second conductive bridges $PW2_1$, $PW2_2$.

In FIGS. 8-9, a further example of the current sensing device 1 is shown.

In this case, the current sensing device 1 is designed for an arc fault detection arrangement configured according to the embodiment shown in FIG. 7.

The current sensing device 1 comprises an outer enclosure 4 accommodating a toroidal core forming the magnetic circuit 2 and the secondary winding means 22 of the current sensing device.

The outer enclosure 4 comprises the first portion 41 mechanically fixed to the support 60 and the second portion 42 mechanically coupled with the first portion 41 (horizontal mounting of the core 2).

The first portion 41 comprises the output sub-portion 410 accommodating the terminals S1, S2, S3 of the secondary winding conductors SW1, SW2 of the secondary winding means 22.

The current sensing device 1 comprises the first rigid conductive bridge $PW1_1$ forming the first primary winding conductor of the current sensing device 1.

The current sensing device 1 comprises also the second rigid conductive bridge $PW2_1$ forming the second primary winding conductor of the current sensing device 1.

The first and second conductive bridges $PW1_1$, $PW2_1$ are arranged externally to the outer enclosure 4.

The first and second conductive bridges $PW1_1$, $PW2_1$ are U-shaped and have their leg portions respectively passing through and out of the core 2 and directed towards the support 60, in such a way to be coupled with the support 60 at the ends T1, T2, T3, T4.

The second portion 41 of the enclosure 4 comprises first deformable protrusions 46 removably coupled with leg portions of the first conductive bridge $PW1_1$.

The current sensing device 1 comprises also the second rigid conductive bridges $PW2_1$, $PW2_2$ forming the second primary winding conductors of the current sensing device 1.

The second portion 41 of the enclosure 4 comprises second deformable protrusions 47 removably coupled with the leg portions of the second conductive bridges $PW2_1$.

According to further alternative embodiments of the invention (not shown), the secondary winding means 22 may include one or more corresponding further rigid conductive bridges arranged externally to the outer enclosure 4.

According to further alternative embodiments of the invention (not shown), the outer enclosure 4 is adapted to define a volume in air.

The secondary winding means 22 of the current sensing device may accommodated in such a volume. In this case, they may be formed by turns wounded in air.

As an alternative, the secondary winding means 22 may include one or more corresponding further rigid conductive bridges arranged externally to the outer enclosure 4.

According to possible embodiments of the invention, the current sensing device 1 comprises primary winding conductors formed by conductive tracks deposited on a support 60 (e.g. a PCB).

The current sensing device 1 comprises one or more first primary conductive tracks $PW1_1$ forming the first primary winding conductors of the current sensing device 1 and one or more second primary conductive tracks $PW2_1$ forming the second primary winding conductors of the current sensing device 1.

The first and second primary conductive tracks $PW1_1$, $PW2_1$ are advantageously deposited on the support 60 with deposition techniques of known type.

The current sensing device 1 comprises first secondary winding conductors SW1, and possibly the second secondary winding conductors SW2, which are advantageously arranged so as to be magnetically coupleable with the first and second primary conductive tracks forming the first and second primary winding conductors of the current sensing device.

The current sensing device 1 may comprise an outer enclosure (not shown) defining a volume for accommodating at least partially the first and the secondary winding means 21, 22 of the current sensing device.

In FIG. 10, a further example of the current sensing device 1 is shown.

In this case, the current sensing device 1 is designed for an arc fault detection arrangement configured according to the embodiment shown in FIG. 7.

The current sensing device 1 comprises a magnetic circuit 2 formed by a magnetic flux path fully realized in air (Rogowski coil in air).

The current sensing device 1 comprises the first and second primary conductive tracks $PW1_1$, $PW2_1$ forming the first and second primary winding conductors of the current sensing device 1.

The current sensing device 1 comprises also first and second secondary winding conductors SW1, SW2 that are formed by multiple turns wounded in air.

The first and second secondary winding conductors SW1, SW2 are positioned adjacent to the first and second primary conductive tracks $PW1_1$, $PW2_1$ so as to be magnetically coupleable with these latter, through the magnetic circuit 2.

The current sensing device 1 may comprise additional conductive tracks 220 deposited on the support 60 to electrically connect the first and second secondary winding conductors SW1, SW2 with the respective terminals S1, S2, S3.

The mentioned conductive tracks $PW1_1$, $PW2_1$, 220 may be deposited on a support 60 with deposition techniques of known type.

The arc fault detection arrangement, according to the invention, allows achieving the intended aims and objects.

The arc fault detection arrangement, according to the invention, allows obtaining high attenuation levels of common mode disturbances. This allows obtaining high levels of reliability in arc fault detection and consequent high levels of immunity to false tripping.

The arc fault detection arrangement, according to the invention, has a particularly simple structure.

In particular, the arc fault detection arrangement, according to the invention, comprises a current sensing device having a sturdy and compact structure, which can be manufactured at industrial level with highly automated operations and which is easily mountable on a PCB support.

The PCB-mountable construction of the current sensing device allows avoiding cabling operations and allows remarkably reducing installation errors.

Further, differently from known solutions of the state of the art, the arc fault detection arrangement, according to the invention, adopts a single arc fault detector for all the electric lines of the DC electric bus.

The arc fault detection arrangement, according to the invention, thus provides relevant advantages in terms of size and cost reduction with respect to known solutions of the state of the art.

The arc fault detection arrangement, according to the invention, can be easily installed on the field and that can be easily integrated with other parts or components of the electric apparatus, to which it is dedicated. This allows obtaining a further reduction of manufacturing and installation costs with respect to known solutions of the state of the art.

The invention claimed is:

1. An arc fault detection arrangement for a DC electric bus, said DC electric bus having one or more electric lines (L1, L2, LN) adapted to electrically connect a source section and a load section of an electric apparatus, said arc fault detection arrangement comprising an arc fault detector adapted to receive and process detection signals (DS) indicative of AC currents flowing along said electric lines (L1, L2, LN) characterised in that it comprises a current sensing device comprising:

a common magnetic core forming a magnetic circuit;
primary and secondary winding means magnetically associated to said magnetic circuit;
wherein said primary winding means comprises one or more first primary winding conductors ($PW1_1$, $PW1_2$, $PW1_N$) and one or more second primary winding conductors ($PW2_1$, $PW2_2$, $PW2_N$) adapted to be electrically connected in series with source portions ($C1_S$, $C2_S$) and load portions ($C1_L$, $C2_L$) of corresponding first and second line conductors (C1, C2) of said electric lines (L1, L2, LN), so that common-mode electric currents flowing along said first and second primary winding conductors ($PW1_1$, $PW1_2$, $PW1_N$, $PW2_1$, $PW2_2$, $PW2_N$) generate magnetic fluxes with opposite directions;
wherein said secondary winding means are magnetically coupleable with said first primary winding means, said secondary winding means comprising at least a first secondary winding conductor (SW1) electrically connected with said arc fault detector to provide said detection signals (DS) to said arc fault detector.

2. The arc fault detection arrangement, according to claim 1, wherein said first and second primary winding conductors ($PW1_1$, $PW1_N$, $PW2_1$, $PW2_N$) are adapted to be electrically connected to the source portions ($C1_S$, $C2_S$) and the load portions ($C1_L$, $C2_L$) of corresponding first and second line conductors (C1, C2) with mutually opposite polarities.

3. The arc fault detection arrangement, according to claim 2, wherein
said first primary winding conductors ($PW1_1$, $PW1_N$) have positive terminals (T1) adapted to be electrically connected with corresponding source terminals ($ST_1$) of the source portions ($C1_S$) of said first conductors (C1) and negative terminals (T2) adapted to be electrically connected with corresponding load terminals ($LT_1$) of the load portions ($C1_L$) of said first conductors C1;
said second primary winding conductors ($PW2_1$, $PW2_N$) have positive terminals (T3) adapted to be electrically connected with corresponding load terminals ($LT_2$) of the load portions $C2_L$ of said second conductors (C2) and negative terminals (T4) adapted to be electrically connected with corresponding source terminals ($ST_2$) of the source portions ($C2_S$) of said second conductors C2.

4. The arc fault detection arrangement, according to claim 2, wherein said secondary winding means comprise at least a second secondary winding conductor (SW2) electrically connected with said arc fault detector to receive a test current provided by said arc fault detector.

5. The arc fault detection arrangement, according to claim 2, wherein:
said first primary winding conductors ($PW1_1$, $PW1_N$) have positive terminals (T1) adapted to be electrically connected with corresponding load terminals ($LT_1$) of the load portions ($C1_L$) of said first conductors (C1) and negative terminals (T2) adapted to be electrically connected with corresponding source terminals ($ST_1$) of the source portions ($C1_S$) of said first conductors (C1);
said second primary winding conductors ($PW2_1$, $PW2_N$) have positive terminals (T3) adapted to be electrically connected with corresponding source terminals ($ST_2$) of the source portions ($C2_S$) of the second conductors (C2) and negative terminals (T4) adapted to be electrically connected with corresponding load terminals ($LT_2$) of the load portions ($C2_L$) of said second conductors C2.

6. The arc fault detection arrangement, according to claim 2, wherein said secondary winding means comprise at least a second secondary winding conductor (SW2) electrically connected with said arc fault detector to receive a test current provided by said arc fault detector.

7. The arc fault detection arrangement, according to claim 2, wherein said first primary winding conductors ($PW1_1$, $PW1_2$, $PW1_N$) and/or said second primary winding conductors ($PW2_1$, $PW2_2$, $PW2_N$) are formed by corresponding rigid conductive elements.

8. The arc fault detection arrangement, according to claim 2, wherein said first primary winding conductors ($PW1_1$, $PW1_2$, $PW1_N$) and/or said second primary winding conductors ($PW2_1$, $PW2_2$, $PW2_N$) are formed by corresponding conductive tracks.

9. The arc fault detection arrangement, according to claim 2, wherein said magnetic circuit has a relative magnetic permeability lower than or equal to 150.

10. The arc fault detection arrangement, according to claim 1, wherein said secondary winding means comprise at least a second secondary winding conductor (SW2) electrically connected with said arc fault detector to receive a test current provided by said arc fault detector.

11. The arc fault detection arrangement, according to claim 1, wherein said first primary winding conductors ($PW1_1$, $PW1_2$, $PW1_N$) and/or said second primary winding conductors ($PW2_1$, $PW2_2$, $PW2_N$) are formed by corresponding rigid conductive elements.

12. The arc fault detection arrangement, according to claim 11, wherein said current sensing device comprises:
an outer enclosure fixable to a support and adapted to define a volume, in which said core and said secondary winding means are accommodated;
one or more first conductive bridges ($PW1_1$, $PW1_2$) forming said first primary winding conductors, said first conductive bridges being coupleable with said support and arranged externally to said outer enclosure;
one or more second conductive bridges ($PW2_1$, $PW2_2$) forming said second primary winding conductors, said second conductive bridges being coupleable with said support and arranged externally to said outer enclosure.

13. The arc fault detection arrangement, according to claim 12, wherein said outer enclosure comprises first retaining means adapted to be removably coupled with said first conductive bridges ($PW1_1$, $PW1_2$).

14. The arc fault detection arrangement, according to claim 13, wherein said outer enclosure comprises second retaining means adapted to be removably coupled with said second conductive bridges ($PW2_1$, $PW2_2$).

15. The arc fault detection arrangement, according to claim 12, wherein said outer enclosure comprises second retaining means adapted to be removably coupled with said second conductive bridges ($PW2_1$, $PW2_2$).

16. The arc fault detection arrangement, according to claim 1, wherein said first primary winding conductors ($PW1_1$, $PW1_2$, $PW1_N$) and/or said second primary winding conductors ($PW2_1$, $PW2_2$, $PW2_N$) are formed by corresponding conductive tracks.

17. The arc fault detection arrangement, according to claim 16, wherein said current sensing device comprises:
one or more first primary conductive tracks ($PW1_1$) forming said first primary winding conductors, said first primary conductive tracks being deposited on said support;

one or more second primary conductive tracks (PW2$_1$) forming said second primary winding conductors, said second primary conductive tracks being deposited on said support.

18. The arc fault detection arrangement, according to claim 1, wherein said magnetic circuit has a relative magnetic permeability lower than or equal to 150.

19. A photovoltaic electric power generation apparatus comprising:
   a source section comprising at least a photovoltaic panel adapted to provide DC electric power;
   a load section comprising at least an inverter section adapted to receive DC electric power and provide AC electric power;
   a DC electric bus having one or more electric lines (L1, LN) electrically connecting said source section with said load section;
   an arc fault detection arrangement, according to claim 1, operatively associated with said DC electric bus.

20. A current sensing device for an arc fault detection arrangement for a DC electric bus, said DC electric bus having one or more electric lines (L1, L2, LN) adapted to electrically connect a source section and a load section of an electric apparatus, wherein the current sensing device comprises:
   a common magnetic core forming a magnetic circuit;
   primary and secondary winding means magnetically associated to said magnetic circuit;
   wherein said primary winding means comprises one or more first primary winding conductors (PW1$_1$, PW1$_2$, PW1$_N$) and one or more second primary winding conductors (PW2$_1$, PW2$z$, PW2$_N$) adapted to be electrically connected in series with source portions (C1$_S$, C2$_S$) and load portions (C1$_L$, C2$_L$) of corresponding first and second line conductors (C1, C2) of said electric lines (L1, L2, LN), so that common-mode electric currents flowing along said first and second primary winding conductors (PW1$_1$, PW1$_2$, PW1$_N$, PW2$_1$, PW2$_2$, PW2$_N$) generate magnetic fluxes with opposite directions;
   wherein said secondary winding means is magnetically coupleable with said first primary winding means, said secondary winding means comprising at least a first secondary winding conductor (SW1) adapted to be electrically connected with said arc fault detector to provide detection signals (DS), which are indicative of AC currents flowing along said electric lines (L1, L2, LN), to said arc fault detector.

* * * * *